(12) United States Patent
Havemose

(10) Patent No.: US 11,031,959 B1
(45) Date of Patent: Jun. 8, 2021

(54) SYSTEM AND METHOD FOR INFORMATIONAL REDUCTION

(71) Applicant: OPEN INVENTION NETWORK LLC, Durham, NC (US)

(72) Inventor: Allan Havemose, Arroyo Grande, CA (US)

(73) Assignee: OPEN INVENTION NETWORK LLC, Durham, NC (US)

( * ) Notice: Subject to any disclaimer, the term of this patent is extended or adjusted under 35 U.S.C. 154(b) by 0 days.

(21) Appl. No.: 16/513,447

(22) Filed: Jul. 16, 2019

Related U.S. Application Data

(63) Continuation of application No. 15/955,354, filed on Apr. 17, 2018, now Pat. No. 10,355,719, which is a continuation of application No. 14/950,754, filed on Nov. 24, 2015, now Pat. No. 9,948,324, which is a continuation of application No. 14/739,611, filed on Jun. 15, 2015, now Pat. No. 10,185,642, which is a continuation of application No. 14/089,234, filed on Nov. 25, 2013, now Pat. No. 9,092,331, which is a continuation of application No. 13/017,340, filed on Jan. 31, 2011, now Pat. No. 8,612,802.

(51) Int. Cl.
*H03M 13/00* (2006.01)
*H03M 13/05* (2006.01)
*G06F 11/10* (2006.01)

(52) U.S. Cl.
CPC ..... *H03M 13/6318* (2013.01); *G06F 11/1076* (2013.01); *H03M 13/05* (2013.01)

(58) Field of Classification Search
CPC .............................................. H03M 13/6318

USPC ................................. 714/766, 764, 767, 770
See application file for complete search history.

(56) References Cited

U.S. PATENT DOCUMENTS

| | | | |
|---|---|---|---|
| 4,233,682 A | 11/1980 | Liebergot et al. | |
| 4,977,390 A | 12/1990 | Saylor et al. | |
| 5,226,150 A * | 7/1993 | Callander | G06F 11/1064 714/57 |
| 5,555,191 A | 9/1996 | Hripcsak | |
| 5,701,313 A * | 12/1997 | Purdham | G06F 11/1044 714/6.11 |
| 5,740,233 A | 4/1998 | Cave et al. | |
| 5,822,401 A | 10/1998 | Cave et al. | |
| 6,434,715 B1 | 8/2002 | Andersen | |
| 6,865,591 B1 | 3/2005 | Garg et al. | |
| 7,243,267 B2 | 7/2007 | Klemm et al. | |
| 7,526,405 B2 | 4/2009 | Miller | |
| 7,590,513 B2 | 9/2009 | Jiang et al. | |
| 7,870,439 B2 | 1/2011 | Fujiyama et al. | |
| 8,122,280 B2 | 2/2012 | Ngan et al. | |
| 8,281,184 B1 | 10/2012 | Havemose | |
| 8,584,145 B1 | 11/2013 | Havemose | |

(Continued)

*Primary Examiner* — Fritz Alphonse

(57) ABSTRACT

Information reduction in data processing environments includes at least one of: one or more Error Correcting Codes that decode n-vectors into k-vectors and utilize said decoding to information-reduce data from a higher dimensional space into a lower dimensional space. The information reduction further provides for a hierarchy of information reduction allowing a variety of information reductions. Transformations are provided to utilize available data space, and data may be transformed using several techniques including windowing functions, filters in the time and frequency domains, or any numeric processing on the data.

20 Claims, 11 Drawing Sheets

(56) References Cited

U.S. PATENT DOCUMENTS

| | | |
|---|---|---|
| 8,589,953 B1 | 11/2013 | Havemose |
| 8,612,802 B1 | 12/2013 | Havemose |
| 9,471,423 B1 | 10/2016 | Healy et al. |
| 9,628,499 B1 | 4/2017 | Yu et al. |
| 9,646,155 B2 | 5/2017 | Singla et al. |
| 9,948,342 B2 | 4/2018 | Shi et al. |
| 9,949,324 B2 * | 4/2018 | Jelaca .................. H05B 45/60 |
| 10,185,642 B1 | 1/2019 | Havemose |
| 10,191,796 B1 | 1/2019 | Havemose |
| 10,481,904 B1 * | 11/2019 | Ledet .................... H04L 51/046 |
| 10,567,316 B2 * | 2/2020 | Ledet ........................ G06F 8/33 |
| 2003/0046026 A1 | 3/2003 | Levy et al. |
| 2005/0193229 A1 | 9/2005 | Garg et al. |
| 2005/0278703 A1 | 12/2005 | Lo et al. |
| 2006/0020866 A1 | 1/2006 | Lo et al. |
| 2006/0026467 A1 | 2/2006 | Nehab et al. |
| 2006/0061795 A1 | 3/2006 | Walmsley |
| 2006/0063521 A1 | 3/2006 | Cheung et al. |
| 2006/0184340 A1 | 8/2006 | Fukuda et al. |
| 2007/0028219 A1 | 2/2007 | Miller et al. |
| 2007/0055914 A1 | 3/2007 | Chandwani et al. |
| 2008/0046477 A1 | 2/2008 | Schultz |
| 2008/0177994 A1 | 7/2008 | Mayer |
| 2008/0208527 A1 | 8/2008 | Kavaklioglu |
| 2010/0037242 A1 | 2/2010 | Mannarswamy et al. |
| 2010/0082708 A1 | 4/2010 | Kim et al. |
| 2010/0100774 A1 | 4/2010 | Ding et al. |
| 2011/0219208 A1 | 9/2011 | Asaad et al. |
| 2011/0320234 A1 * | 12/2011 | Mussman ............ G06Q 10/109 705/7.19 |
| 2012/0151276 A1 | 6/2012 | Bjomer et al. |
| 2013/0031422 A1 | 1/2013 | Church et al. |
| 2016/0006457 A1 * | 1/2016 | Best ...................... H03M 13/13 714/755 |
| 2016/0321185 A1 | 11/2016 | Doshi et al. |
| 2017/0163284 A1 | 6/2017 | Conway et al. |
| 2018/0343018 A1 * | 11/2018 | Chen .................... H03M 13/07 |
| 2020/0235757 A1 * | 7/2020 | Achtenberg ...... H03M 13/3723 |

\* cited by examiner

SYSTEM AND METHOD FOR INFORMATIONAL REDUCTION

CROSS-REFERENCE TO RELATED APPLICATIONS

This application is a continuation of U.S. application Ser. No. 15/955,354, filed on Apr. 17, 2018, now U.S. Pat. No. 10,355,719, issued on Jul. 16, 2019, which is a continuation of U.S. application Ser. No. 14/950,754, filed on Nov. 24, 2015, now U.S. Pat. No. 9,948,324, issued on Apr. 17, 2018, which is a continuation of U.S. application Ser. No. 14/739,611, filed on Jun. 15, 2015, now U.S. Pat. No. 10,185,642, issued on Jan. 22, 2019, which is a continuation of U.S. application Ser. No. 14/089,234, filed on Nov. 25, 2013, now U.S. Pat. No. 9,092,331, issued on Jul. 28, 2015, which is a continuation of U.S. application Ser. No. 13/017,340, filed on Jan. 31, 2011, now U.S. Pat. No. 8,612,802, issued on Dec. 17, 2013, the disclosures of which are hereby incorporated by reference.

BACKGROUND OF THE APPLICATION

1. Field of the Application

This application pertains to information reduction, hashing, compression, machine learnings, big-data, and general information processing and analytics running on computer systems, computer networks, telecommunications systems, embedded computer systems, wireless devices such as cell phones, tablets, and PDAs, and more particularly to methods, systems and procedures (i.e., programming) for information reduction, hashing, compression, and information processing performed on a variety of data streams and data sources.

2. Description of Related Art

At times it may be desirable to reduce the amount of information required to represent an item, if the reduced-information description allows similar types of operations to be performed on the information-reduced item as on the original.

By way of example, it is common to abbreviate "Drive" as "Dr.". The representation of "Drive" takes five characters, whereas "Dr." only takes three. This means that two characters of 5 were saved, or a reduction in storage requirement by 40%. In general, however, the savings are not this easily achieved. The term "Doctor" is also abbreviated "Dr.", so by just looking at the representation "Dr." it is not possible to tell if came from "Drive" or "Doctor".

The simplified "Dr." example above is an example of a "lossy" transformation. The transformation is "lossy" in that information is lost: Seen in isolation, it is not possible to determine if a "Dr." corresponds to source data for "Drive" or "Doctor". However, the reduced-information representation "Dr." may still be used accurately for sorting, and as such is a good representation for both Drive and Doctor.

A similar technique is that of a "hash function". A "hash function" maps data of possibly arbitrary length to an information-reduced representation of smaller and generally fixed length. Hash functions are well known in the art and will only be described to the extent necessary to teach the present application. The general "idea" of hash functions is that two different source data generally will generate different hash values. Hash functions are thus generally effective for quickly determining if two source data are identical. Hash functions have many other uses, some of which are explored below.

A related technique is that of "Message Digests". A message digest is a secure one-way hash functions generally producing a fixed-length number used for comparison. Well-known Message Digest Algorithms include Message Digest 5 and 6 (MD5 and MD6) and Secure Hash Algorithm n (SHA-1, SHA-2, etc.). The algorithms for MDx and SHA-x are public and will only be described as necessary to illuminate the present application. In continuation of the "Dr." example above: There is no guarantee, and it is generally not the case, that a message digest of "Drive" and "Doctor" will be identical, or that the associated message digests will sort the same way as "Drive" and "Doctor".

Similarly, the filtering operations typically performed by Map in a Map-Reduce environment, performs operations that groups similar data by associating the data with a "key". Map-Reduce thus similarly apply the concept of reducing information representation for source data.

Data Compression algorithms are another way to reduce the size of the source data: a "lossless" data compression algorithm encodes the source data with fewer bits than the original representation in a manner that allows the original source data to be recreated accurately from the compressed representation. A "lossy" compression algorithm encodes the source data with fewer bits than the original representation and in a manner that does not necessarily allow full restoration of the source data. By way of example, the "zip" compression algorithm is lossless, whereas the mp3 compression used for audio-compression is lossy.

Whereas hash-functions generally work by reducing the representation of the source data to a representation that is smaller and easier to perform certain operations on, an Error Correcting Code (ECC) typically works by adding redundancy to the source data. The general idea behind Error Correcting Codes is to add redundancy, i.e. extra data, to a message prior to sending it. The receiver of a message can use the extra data to determine if the message was corrupted in transit and within certain limits, use the extra data to correct transmission errors. A modern reference for Error Correcting Codes may be found in W. Cary Huffman and Vera Pless "Fundamentals of Error Correcting Codes" Cambridge Press 2003 (Huffman & Pless). Techniques from Error Correction Codes will be introduced in the teachings below and only taught as necessary to illustrate the present application.

In machine learning and "big data" environments it is similarly often advantageous to pre-process source data in a manner that reduces the size of the data sets being processed.

One of the challenges in information reduction is to find an acceptable tradeoff between the amounts of information reduction, the amount of processing it takes to produce the information-reduced representation, and the "usefulness" of the information reduced data in the context of the use of the data.

There is therefore a need for data reduction systems and methods that allow flexible tradeoffs between processing requirements, amount of data reduction, and that allows effective use of the information reduced representation. The present application provides such information reduction services as system services, kernel modules, user-space processes, or a combination thereof. The present application works on modern operating systems whether virtualized or not.

BRIEF SUMMARY OF THE APPLICATION

The present application provides information reduction that works on commodity operating system and hardware.

The terms "information reduction", "reducing information" and "information reduction services" are utilized herein interchangeably to designate a set of services that reduces informational content in one or more data streams. The information reduction may be implemented as one or more of a system service, kernel module, user-space processes or a combination.

Information reduction, as taught by the present application, operates on the principle of converting a data representation from a higher-dimensional space to an alternate representation in a lower-dimensional space with the expectation that operations in the lower dimensional space are good approximations to equivalent operations in the higher-dimensional space. Similarly, the principle of the present application can generally be viewed as converting a data representation of one or more objects to new representations using fewer bytes, thus not necessarily invoking the concept of dimension in describing the application. These aspects of the present application will be further explored in the "DETAILED DESCRIPTION" section. Similarly, the principle of the present application can be viewed as converting a data representation of one or more objects to representations using fewer bytes.

The present application utilizes multi-dimensional state-space representations and teaches operations across the state spaces to provide the informational reduction.

The following terms are also used throughout the disclosures:

The terms "Windows®" and "Microsoft Windows®" (WINDOWS) are utilized herein interchangeably to designate any and all versions of the Microsoft Windows operating systems. By example, and not limitation, this includes but is not limited to Windows XP, Windows Server 2003, Windows Server 2008, Windows Server 2012, Windows NT, Windows Vista, Windows 7, Windows 8, Windows 10, Windows Mobile, Windows RT, and Windows Embedded. The operation and design of Microsoft Windows is well documented on the web at msdn.microsoft.com.

The terms "Linux" and "UNIX" are utilized herein to designate any and all variants of Linux and UNIX. By example, and not limitation, this includes RedHat Linux, Suse Linux, Ubuntu Linux, HPUX (HP UNIX), Android, and Solaris (Sun UNIX). The design and operation of the Linux operating system is well documented on the web at www.kernel.org.

The terms "iOS" and "MacOS" are utilized herein to designate any and all variants of Apple's iOS devices and Macintosh operating systems. By example, and not limitation, this includes operating systems for iPhones, iPads, iPods, and the Macintosh product lines.

The terms "node", "host", "device", "computer", and "server" are utilized herein interchangeably to designate one or more processors running a single instance of an operating system. A virtual machine, such as a VMware, KVM, Virtual Box®, or XEN VM instance, is also considered a "node". Using VM technology, it is possible to have multiple nodes on one physical server.

The terms "application" or as appropriate "multi-process application" are utilized to designate a grouping of one or more processes, where each process can consist of one or more threads. Operating systems generally launch an application by creating the application's initial process and letting that initial process run/execute. In the following teachings we often identify the application at launch time with said initial process.

As an application is a grouping of one or more processes, an application may thus be comprised of one or more other applications, each of which in turn is comprised of one of more processes. This hierarchy of application may continue to any depth without loss of generality.

In the following we use commonly known terms including but not limited to "client", "server", "API", "java", "process", "process ID (PID)", "thread", "thread ID (TID)", "thread local storage (TLS)", "instruction pointer", "stack", "kernel", "kernel module", "loadable kernel module", "heap", "stack", "files", "disk", "CPU", "CPU registers", "storage", "memory", "memory segments", "address space", "semaphore", "loader", "system loader", "system path", "sockets", "TCP/IP", "http", "ftp", "Inter-process communication (IPC)", "Asynchronous Procedure Calls (APC)", "POSIX", "certificate", "certificate authority", "Secure Socket Layer", "SSL", MD-5", "MD-6", "Message Digest", "SHA", "Secure Hash Algorithm", "NSA", "NIST", "private key", "public key", "key pair", and "hash collision", and "signal". These terms are well known in the art and thus will not be described in detail herein.

The term "transport" is utilized to designate the connection, mechanism and/or protocols used for communicating across the distributed application. Examples of transport include TCP/IP, UDP, Message Passing Interface (MPI), Myrinet, Fibre Channel, ATM, shared memory, DMA, RDMA, system buses, and custom backplanes. In the following, the term "transport driver" is utilized to designate the implementation of the transport. By way of example, the transport driver for TCP/IP would be the local TCP/IP stack running on the host.

The term "interception" is used to designate the mechanism by which an application re-directs a system call or library call to a new implementation. On Linux and other UNIX variants interception may, by way of example, be achieved by a combination of LD_PRELOAD, wrapper functions, identically named functions resolved earlier in the load process, and changes to the kernel sys_call_table. On Windows, interception may be achieved, by way of example, by modifying a process' Import Address Table and creating Trampoline functions, as documented by "Detours: Binary Interception of Win32 Functions" by Galen Hunt and Doug Brubacher, Microsoft Research July 1999". Throughout the rest of this document the terminology interception to designate the functionality across all operating systems. The terminology pre-loading is used to designate the process of loading the interceptors into the application's address space on all operating systems.

The terms "plugin", "plug-in", "add-on", "add-in", and "extension" are used interchangeably to designate a software component that adds one or more features to an existing program. Plugins are often used to enable customization, but may provide any functionality. Plugins are commonly used in web-browsers, media players, and to provide themes/skins for user interfaces. In the following disclosures the term "plugin" is used to describe all said functionality.

The term "transparent" is used herein to designate that no modification to the application is required. In other words, the present application works directly on the application binary without needing any application customization, source code modifications, recompilation, re-linking, special installation, custom agents, operating system changes, or other extensions.

The term "fork( )" is used to designate the operating system mechanism used to create a new running process. On Linux, Solaris, and other UNIX variants, a family of fork( ) calls is provided. On Windows, one of the equivalent calls is "CreateProcess( )". Throughout the rest of this document we use the term "fork" to designate the functionality across all operating systems, not just on Linux/Unix. In general fork( ) makes a copy of the process making the fork( ) call. This means that the newly created process has a copy of the entire address space, including all variables, I/O etc. of the parent process.

The term "exec( )" is used to designate the operating system mechanism used to overlay a new image on top of an already existing process. On Linux, Solaris, and other UNIX a family of exec( ) calls is provided. On Windows, the equivalent functionality is provided by e.g. "CreateProcess( )" via parameters. Throughout the rest of this document we use the term "exec" to designate the functionality across all operating systems, not just Linux/Unix. In general, exec( ) overwrites the entire address space of the process calling exec( ). A new process is not created and data, heap and stacks of the calling process are replaced by those of the new process. A few elements are preserved, including but not limited to process-ID, UID, open file descriptors and user-limits.

The terms "barrier" and "barrier synchronization" are used herein to designate a type of synchronization method. A barrier for a group of processes and threads is a point in the execution where all threads and processes must stop before being allowed to proceed. Barriers are typically implemented using semaphores, mutexes, locks, event objects, or other equivalent system functionality. Barriers are well known in the art and will not be described further here.

Modern operating systems such as Windows, MacOS, Android, iOS, and Linux separate the address space into kernel space and user space. Kernel space is the address space reserved for running the kernel, kernel extensions, and depending on operating system, device drivers. User space is the address space in which user processes (i.e. applications) run. Functionality may be added to the kernel using Loadable Kernel Module (LKM). Loadable kernel modules are also called Kernel Loadable Modules (KLM), kernel extensions, or simply Kernel Modules. Throughout the rest of this document we use the terms Loadable Kernel Module and kernel module interchangeably to designate the functionality across all operating systems.

To avoid simultaneous use of shared resources in multi-threaded multi-process applications locking is used. Several techniques and software constructs exists to arbitrate access to resources. Examples include, but are not limited to, mutexes, semaphores, futexes, critical sections and monitors. All serve similar purposes and often vary little from one implementation and operating system to another. In the following, the term "Lock" is used to designate any and all such locking mechanism. Properly written multi-process and multi-threaded application use locking to arbitrate access to shared resources An aspect of the present application is to reduce the amount of information required to represent a data stream. In one example embodiment an error correcting code is employed and a decode process is viewed as dimensional reduction.

Another aspect of the present invention is in an example embodiment, a use of a linear code for said dimensional reduction.

Another aspect of the present application is in an example embodiment, a use of the minimum distance of a linear code to estimate the dimensional reduction.

Yet another aspect of the present application is in an example embodiment, a use of Galois Fields (GF) with base two to represent binary numbers, and GF($2^8$) to represent bytes.

Another aspect of the present application is in an example embodiment, an application to Hashing and Locally Sensitive Hashing.

Another aspect of the present application is in an example embodiment, a hierarchy of error correcting codes to provide hierarchical informational reduction.

Another aspect of the present application is in an example embodiment, an application to lossy or loss-less compression.

Another aspect of the present application is in an example embodiment, an application to Search and Nearest Neighbor Search.

Another aspect of the present application is in an example embodiment, an application to biometrics such as finger print readers, voice recognition, spoken passwords, and other biometric measurements and metrics.

Another aspect of the present application is in an example embodiment, an application to external sensors such as finger print readers, thermometers, and generally sensors producing a digital data stream.

Another aspect of the present application is in an example embodiment, preprocessing, mapping and transformation of one or more data streams using one or more of moving windows, Fisher transforms, Inverse Fisher transforms, alpha mappings, Fourier, Hilbert, Filter banks, Convolution filters, digital filters, and numeric processing of data.

Another aspect of the present application is in an example embodiment, an implementation using kernel modules, device drivers, loadable kernel modules or kernel extensions, libraries, plug-ins, application programming interfaces (APIs), and application software.

Another aspect of the present application is in an example embodiment, applications to data mining and big data, hosted applications and application streaming, desktop and server applications, and mobile applications.

Another aspect of the present application is in an example embodiment, an application to data streams generated by sensors, external devices, software, or by other means.

A further aspect of the present application is that it can be provided on commodity operating systems such as Linux, Windows, iOS, Android, MacOS, QNX, and on commodity hardware such as Intel®, AMD® (Advance Micro Devices), SPARC® (Scalable Processor Architecture), ARM® (Advance Risk Machines), and MIPS® (Microprocessor without Interlocked Pipeline Stages). The present application thus works on commodity operating systems, commodity hardware with standard (off the shelf) software.

Further aspects of the application will be brought out in the following portions of the specification, wherein the detailed description is for the purpose of fully disclosing preferred embodiments of the application without placing limitations thereon.

BRIEF DESCRIPTION OF THE DRAWINGS

The application will be more fully understood by reference to the following drawings which are for illustrative purposes only.

DETAILED DESCRIPTION OF THE APPLICATION

Referring more specifically to the drawings, for illustrative purposes the present application will be disclosed in relation to FIG. 1 through FIG. 11. It will be appreciated that the system and apparatus of the application may vary as to configuration and as to details of the constituent components, and that the method may vary as to the specific steps and sequence, without departing from the basic concepts as disclosed herein.

0. INTRODUCTION

The context in which this application is disclosed is an application running on one computer. Without affecting the general case of multiple applications, the following disclosures often depict and describe just one application. Multiple primary applications are handled in a similar manner.

Likewise, the disclosures generally describe applications with one or two processes; any number of processes is handled in a similar manner. Finally, the disclosures generally describe one or two threads per process; any number of threads is handled in a similar manner

1. OVERVIEW

Figure 1:
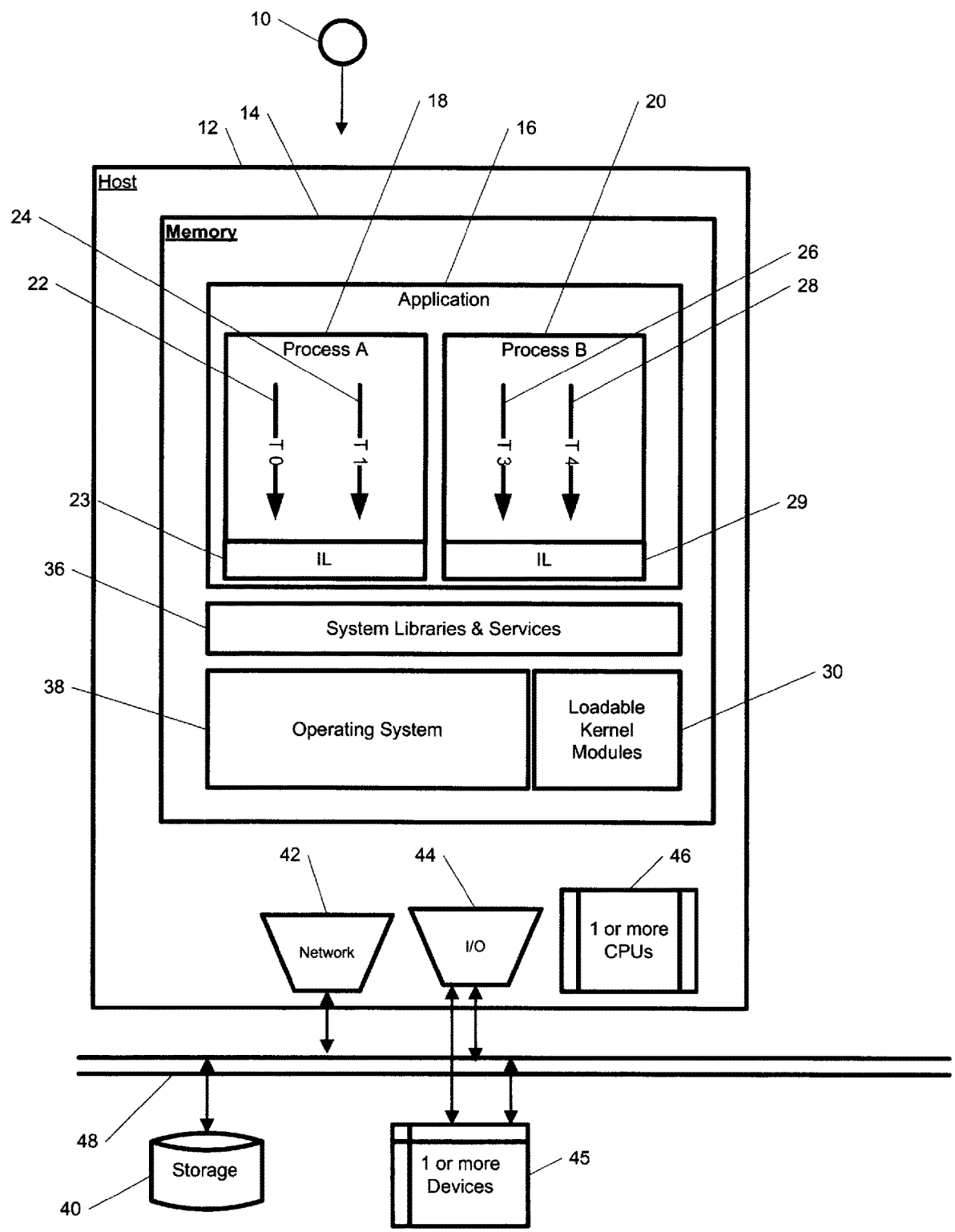
FIG. 1 is a block diagram of the core system architecture

FIG. 1 illustrates by way of example embodiment 10 the overall structure of the present application. The following brief overview illustrates the high-level relationship between the various components; further details on the inner workings and interdependencies are provided in the following sections. FIG. 1 Illustrates by way of example embodiment 10 a host 12 with an application 16 loaded into system memory 14. The application 16 is comprised of two processes; process A 18 and process B 20. Each of the two processes has two running threads. Process A contains thread T0 22 and thread T1 24, while process B contains thread T3 26 and thread T4 28. As part of loading the application 16 an interception layer (IL) 23, 29 is pre-loaded into the address space of each process. Interception Layer 23 for process A is preloaded into process A's address space and Interception Layer 29 is preloaded into process B's address space. The system libraries and system services 36 are generally interposed between the application 16 and operating system 38. Alongside with the operating system 38 are the loadable kernel modules 30.

System resources, such as CPUs 46, I/O devices 44, Network interfaces 42 and storage 40 are accessed using the operating system 38 and the loadable kernel modules 30. Storage may include hard drives, flash drives, or other non-transitory storage devices. Devices accessing remote resources use some form of transport network 48. By way of example, system networking 42 may use TCP/IP over Ethernet transport, Storage 40 may use Fibre Channel or Ethernet transport, and I/O 44 may use USB.

One or more external devices 45 may be connected to the host 12 either via the network 48 or a connection though I/O 44, or through other interfaces.

FIG. 1 illustrates the system libraries 36 as separate from the application 16 and the individual processes process A 18 and process B 20. The system libraries are generally shared libraries. For clarity of presentation, the system libraries are depicted outside the address space of the individual processes, even though some library state and code is present within the address space of the individual application processes.

In an alternate embodiment the functionality of the kernel module 30 is built into, i.e. compiled into, the kernel. This eliminates the need to load the kernel module, at the expense of being custom kernel. The preferred embodiment disclosed herein provides services as kernel modules, but it is obvious to anyone with ordinary skills in the art the kernel module functionality could be compiled into the kernel as disclosed for the alternate embodiment.

FIG. 1 illustrates the application with an Interception Layer IL 23, 29 for each process. In a preferred embodiment using interception, the interception Layer is present. In a preferred embodiment not using interception, the interception Layer is absent, or configured to not perform any interceptions.

1. Information Reduction Overview

Figure 2:
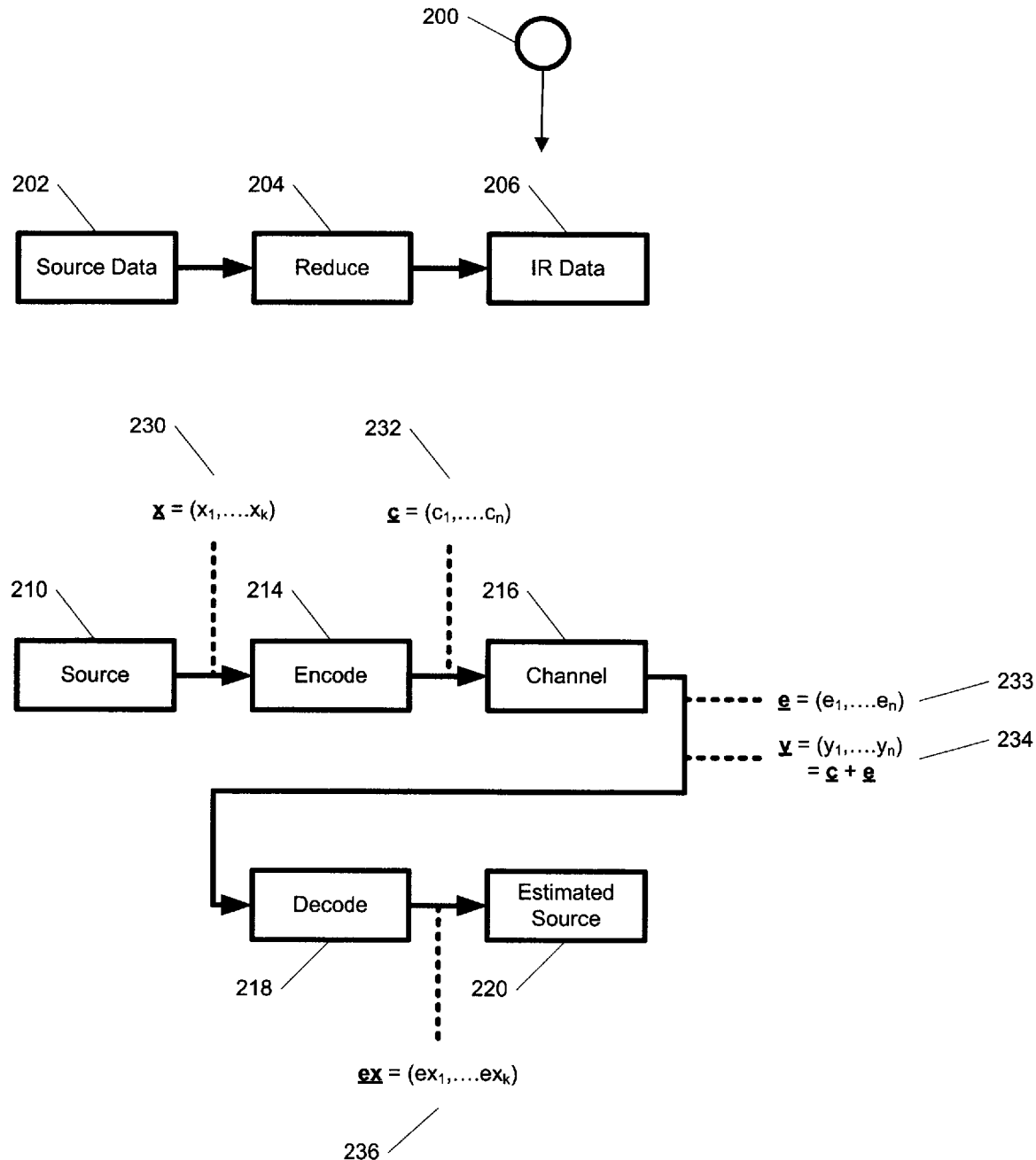
FIG. 2 is a block diagram illustrating information reduction and an encoding and decoding pipeline.

FIG. 2. Illustrates by way of example embodiment 200 various high-level aspects of information reduction as taught by the present application.

Source data 202 is reduced 204 to provide the Information Reduced data (IR Data) 206.

In comparison, the typical Error Correction Code pipeline (ECC) teaches a partially similar-looking setup with Source data 210 being encoded 214 and transmitted over a noisy channel 216. At the receiving end, the received message is decoded 218 for an estimated source message 220. In the following teachings the focus is on linear codes; however the application applies to both linear and non-linear codes.

For clarity, we designate a vector $\underline{x}$ in underlined bold, a scalar in normal font (e.g. x or $x_1$), and a matrix $\underline{M}$ in upper case underlined bold.

Referring to FIG. 2 again, $\underline{x}=(x_1, \ldots x_k)$ 230 designates the source data 210 as a vector of dimension (i.e. length) k. Encoding 114 produces a code-word 232 $\underline{c}=(c_1, \ldots c_n)$ as a vector of dimension (i.e. length) n, where n>k. The encoding step essentially adds (n−k) dimensions of redundant information. After being transmitted through the Channel 216, $\underline{y}=(y_1, \ldots y_n)$ 234 is received with any channel errors $\underline{e}$ 233 introduced, and decoded 218 into an estimate for $\underline{x}$ 236 $\underline{ex}=(ex_1, \ldots ex_k)$. Generally the channel is expected to introduce errors, so the received $\underline{y}$ may be considered to be the code word $\underline{c}$ with additional errors $\underline{e}$ introduced; written as $\underline{y}=\underline{c}+\underline{e}$.

This mathematical description of a typical error correction pipeline provides a consistent description of encoding and decoding and readily supports a large variety of ECCs. Please see Huffman & Pless Chapter I for an introduction. The encoding of the source vector $\underline{x}$ of dimension k to a code word $\underline{c}$ of dimension n may thus be viewed as adding (n−k) extra dimensions of redundant information, where the redundant information is constructed in such a way that it can assist in identifying any errors introduced in the channel. The individual elements of the vectors $\underline{x}$, $\underline{c}$, $\underline{e}$, and $\underline{y}$ are considered elements of a finite field $F_q$. Finite Fields are taught in Huffman & Pless Chapter 3 and will only be described as necessary to teach the present application. By way of example, if q=256 one may consider $F_{256}$ as describing "bytes" of data, even though that only is accurate as far as size and some operations go. To simplify notation a finite field $F_q$ is also written as GF(q) "Galois Field" in honor of Galois, who formalized the mathematics of finite fields. Similarly, q=2 may be thought of as representing "bits".

A linear error correction code is called an [n,k] linear code or an [n,k,d] linear code, where d designates the minimum distance (please see next section). The encoding (FIG. 2 214) may be viewed as a matrix multiply by a Generator Matrix (G)

$$\underline{c} = \underline{x} * \underline{g}$$

where $\underline{c}$ is the code word of length (dimension) n, $\underline{x}$ is the source data of length (dimension) k, and G is a Generator matrix of dimension k×n. The Generator Matrix may be written in standard form by recognizing that the first k×k columns may be written as the identity matrix $\underline{I}_k$ with the rest of $\underline{G}$ comprising the redundancy generating columns ($\underline{P}_k$):

$$\underline{G} = [\underline{I}_k | \underline{P}_k]$$

Similarly, certain aspects of decoding can be viewed as a Matrix multiply of the received code word y by a Parity Check Matrix (H)

$$\underline{H} = [-\underline{P}^T | \underline{I}_{n-k}]$$

Where $\underline{H}$ denotes the parity check matrix, and $\underline{P}^T$ the transpose of $\underline{P}$ (the Parity check components of the standardized Generator H matrix).

By calculating a syndrome $\underline{s}$ $$\underline{s} = \underline{H} * \underline{y}^T$$

Code words are identified by satisfying $\underline{s}=\underline{0}$, i.e. by having a zero syndrome.

1.1 Minimum Distance

An important aspect of an error correcting code is the minimum distance. The minimum distance between two vectors $d(\underline{x},\underline{y})$, or $d_{min}$ or d when the context is clear, is defined as the number of coordinates in which the two vectors differ.

The minimum distance, is a measure of the error-correcting ability of a particular code. The minimum distance is not always known, but in view of the construction above, the Singleton bound states:

$$d <= n-k+1$$

This upper bound indicates the maximum separation achieved by adding redundancy, i.e. by adding (n-k) dimensions of redundancy as described above.

The minimum distance is important for the following reasons (see Huffman & Pless)

An error correcting code can detect (d−1) errors

An error correcting code can correct (d−1)/2 errors

Figure 3:
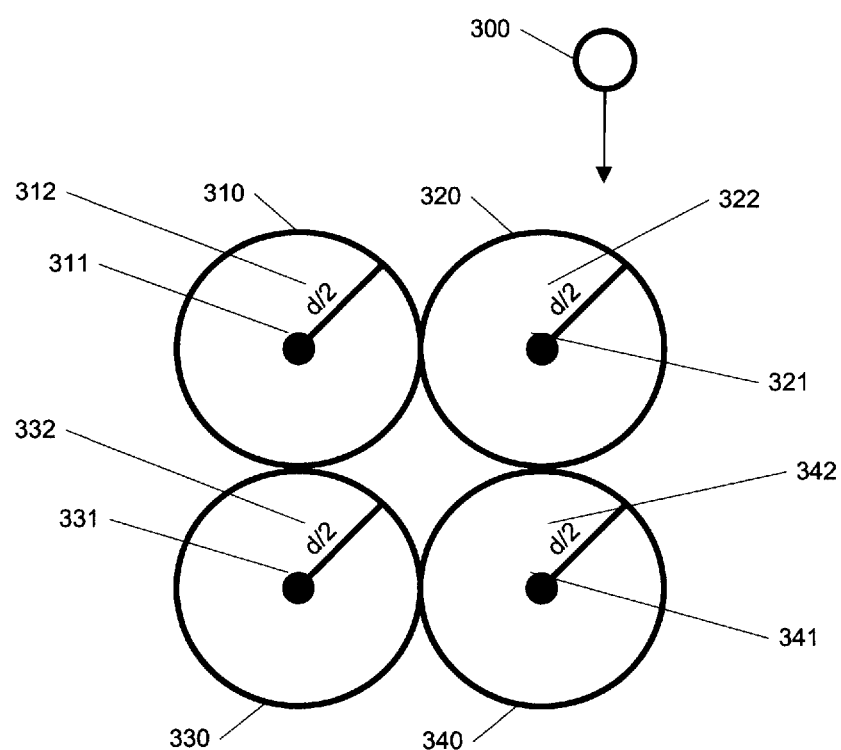
FIG. 3 is a block diagram illustrating code words in an error correcting code.

FIG. 3 illustrates this in two dimensions by way of an example embodiment 300 with four code words 311, 321, 331, 341 arranged such that the minimum distance between two code words is "d" 310, 320, 330, 340. The minimum distance is indicated for each code word 312, 322, 332, 342 as a radial line of length d/2. While FIG. 3 illustrates the minimum distance in two dimensions the illustration readily extends to any number of dimensions.

For a given [n,k] the larger the minimum distance, the better error correcting ability the code has. It is therefore generally of interest to find ECCs with the highest possible minimum distance for a given [n,k]. However, in practice the computational complexity of an [n,k,d] ECC is also an important factor, and it is common to choose a an [n,k,d] ECC that is not optimal if its computationally efficient. ECCs that meet the Singleton bound are called maximum distance separable codes (MDS codes).

2.0 Informational Reduction and Error Correction

Looking at the ECC description in section 1 from a different perspective it can be viewed as:

1. a k-dimensional data space ("source") is transformed ("encoded") by adding redundant information by an [n,k,d] ECC and thereby embedded into an n-dimension space 2. the n-dimensional representation is transmitted over a noisy channel 3. the n-dimensional received data is transformed back ("decoded) into a k-dimensional representation within the limits of the [n,k,d] ECC.

Assuming that no errors have been introduced during transmission, Step 3 essentially takes a higher-dimensional representation of a code word and reduces the representation from n to k dimensions subject to the limitations of the [n,k,d] ECC.

Similarly, the decoding process from step 3 may be applied to any n-dimensional vector, and within the limits of an [n,k,d] ECC produce a k-dimensional representation.

Figure 4:
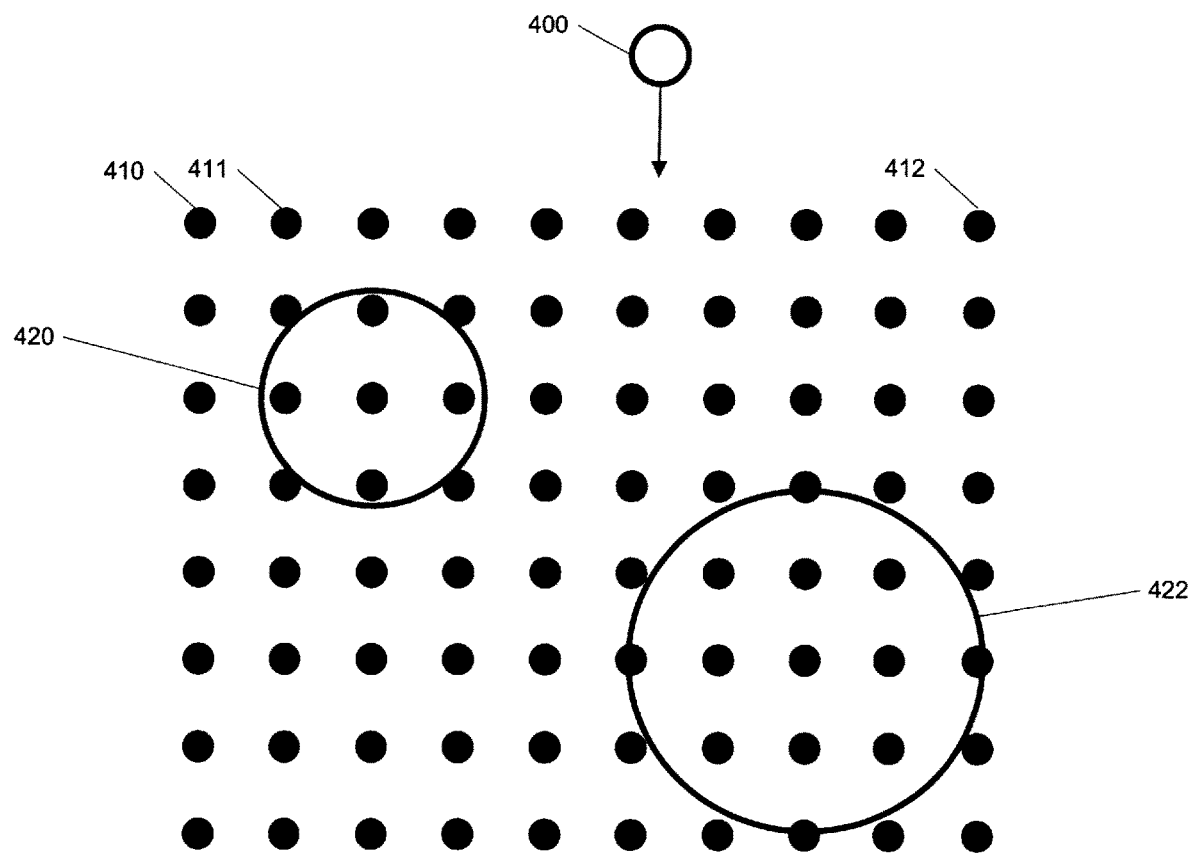
FIG. 4 is a block diagram illustrating multiple error correcting codes over the same code words

FIG. 4 illustrates this in two dimensions by way of an example embodiment 400. n-dimensional encoded code words 410, 411, 412 are indicated in a lattice as black filled circles. Two different ECC with different minimum distances are illustrated: an ECC 420 with the ability to correct 1 error ($d_{min}$=3), and an ECC 422 with the ability to correct 2 errors ($d_{min}$=5).

By choosing ECCs with a larger minimum distances, more error may be corrected, or using different language, more received words $\underline{y}$ may be viewed as corresponding to one source word. Within the limits of the Singleton bound, the decoding process of an ECC may thus be used to reduce the informational content from n dimensions down to k dimensions.

2.1 Example ECCs

A well-known class of error correcting codes is the Reed-Solomon (RS) class of codes. Please see Huffman and Pless for an introduction. Reed-Solomon codes are widely used for error correction in data storage systems including compact disks, data transmission, and satellite communication.

Reed-Solomon codes are [n,k,n−k+1] linear block codes and are thus optimal in the sense that they meet the Singleton bound (they are MDS). RS codes generally have a symbol length (n) of size of the Field over which it's defined. In practice, a field that's a power of 2 is often used, such as $GF(256)=GF(2^8)$, as it naturally corresponds to a bits and bytes of information.

Example RS codes over $F_{256}$ are: RS(255,251,5), RS(255, 239,17), and RS(255,223) with the ability to correct 2, 8 and 16 errors over GF(256) respectively.

Reed Solomon codes are part of the bigger class of cyclic BCH codes (Bose, Ray-Chaudhuri, Hocquenghem). Many other classes of ECCs exist, and the use of RS codes is purely for illustrative purposes. RS codes are, however, good in practice as efficient decoding and encoding algorithms exists. Other classes of Error Correcting codes include Hamming Codes, Golay codes, codes from Algebraic Geometry, Convolutional codes, and repetition codes. There are also many well-known techniques to generate new codes by puncturing, extending, shortening or otherwise combining or changing existing codes.

3.0 DIMENSIONAL REDUCTION

By way of example: If a user intended to search for "linear" but instead typed "lenear" it would be ideal of the search engine automatically could adapt to the spelling error. In the context of the teachings above, it may be observed that the minimum distance between "linear" and "lenear" is 1 (one), as the two words differ in exactly one position. Using an error correcting code with minimum distance 3 or higher, the decoding step (118 on FIG. 1) produces the same re-sourced vector (ex)(236 on FIG. 2) for both "linear" and "lenear".

An [n,k,d] ECC over GF(q) has $q^k$ different source words including the zero source word. This means that all source words are "known" ahead of time, which facilitates pre-calculating static operations.

Figure 5:
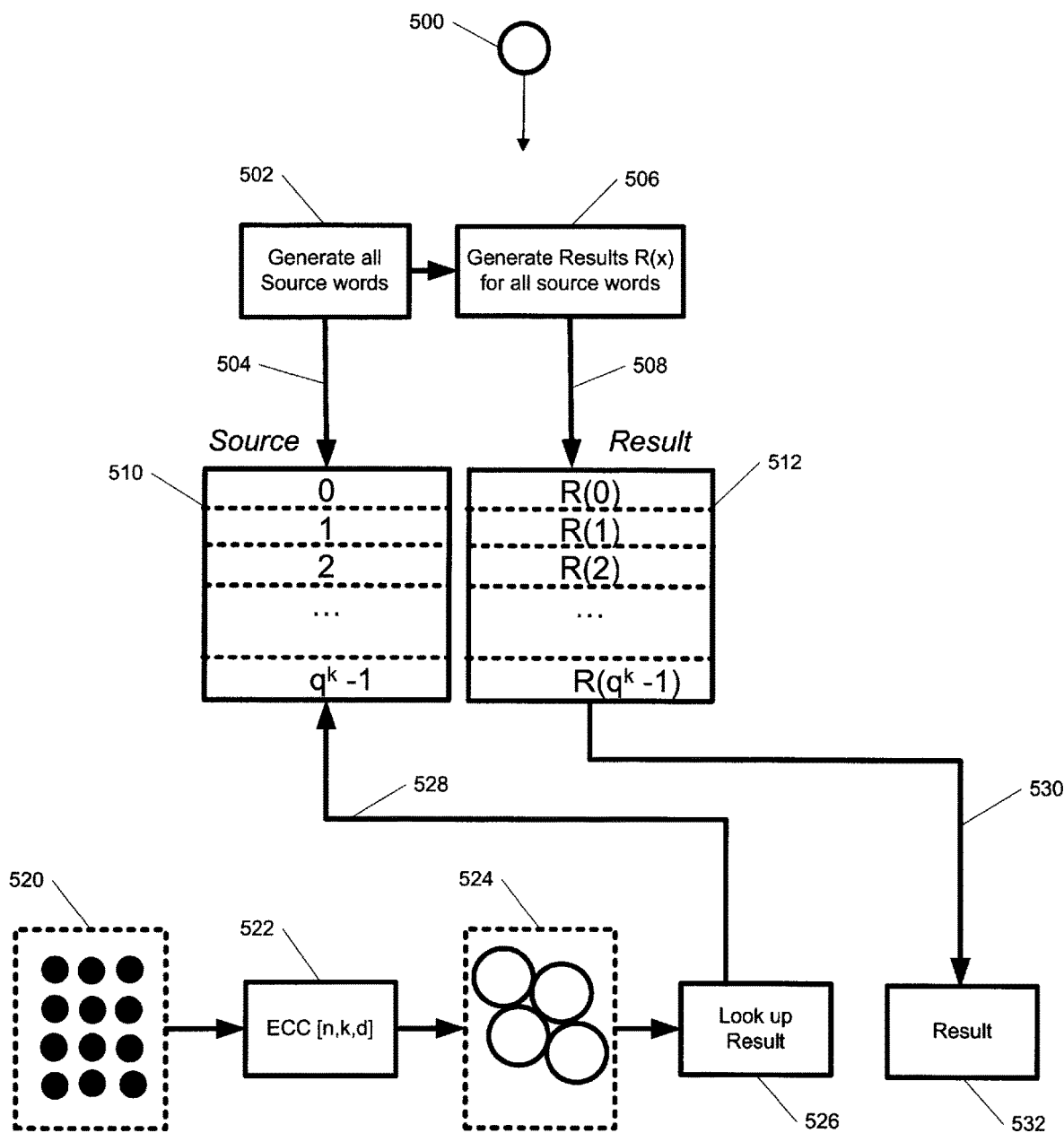
FIG. 5 is a block diagram illustrating dimensional reduction and pre-computation.

FIG. 5 illustrates this by way of an example embodiment 500. In the context of an [n,k,d] ECC, first all source words are generated 502. Generating all source words is comprised of creating 504 all possible k-vectors 510 over GF(q). This is followed by generating the results 506 for all source words. This is comprised of 508, for each source word x performing the associated operation and storing the result R(x) 512. By way of example, and not limitation, if the operation is a database lookup, each source word x is looked up, and R(x) corresponds to the result produced by the data base lookup. If, by way of another example, the operation is a calculation based on the source word, the result is said calculation performed on the source word.

With pre-computed results 512 for all source words, processing of a code word proceeds as follows: Referring to the illustrative embodiment in FIG. 5, a code word 520 is first decoded 522 by the ECC and a corresponding source word 524 calculated. Using the results previously calculated, when needing to perform the operation on a code word 520, the source word produced 524 by the ECC 522 is used 526 to look up 528 the source word and identify the associated result 512, which is returned 530 as the result 532 of the operation. In an alternate embodiment, the Source 510 and Result 512 are not pre-calculated, but instead calculated as needed in the "look up" step 526 and Result 532.

FIG. 5 and the associated teachings thus illustrate a technique whereby results of source words are pre-calculated and prepared for further reference. In applications where results from the same code/source words are accessed repeatedly, it may be advantageous to pre-computing as illustrated.

FIG. 5 also illustrates a much more powerful technique. FIG. 5 and the associated teachings, illustrate the reduction of a problem in a higher-dimensional space, i.e. the code words 520 in n dimensions, to an equivalent problem in a lower k-dimensional space, i.e. source words in k dimensions, by using an [n,k,d] ECC to reduce the code words to source words within the context of a particular ECC and a noise-less channel.

3.1 Hashing as Dimensional Reduction

Hash functions are used in a variety of situations, as previously summarized. One such application is to identify and group similar or identical words in e.g. a text or a directory. This type of hash function is at times called "Locally Sensitive Hashing" (LSH). So whereas a typical hash function is designed to generate different hash-values even for source data that is similar, LSH is designed to generate the same hash value for source data that is similar. Other applications of LSH are finger print recognition, and voice print recognition where the intent is to recognize that slightly different prints likely correspond to the same person.

Figure 6:
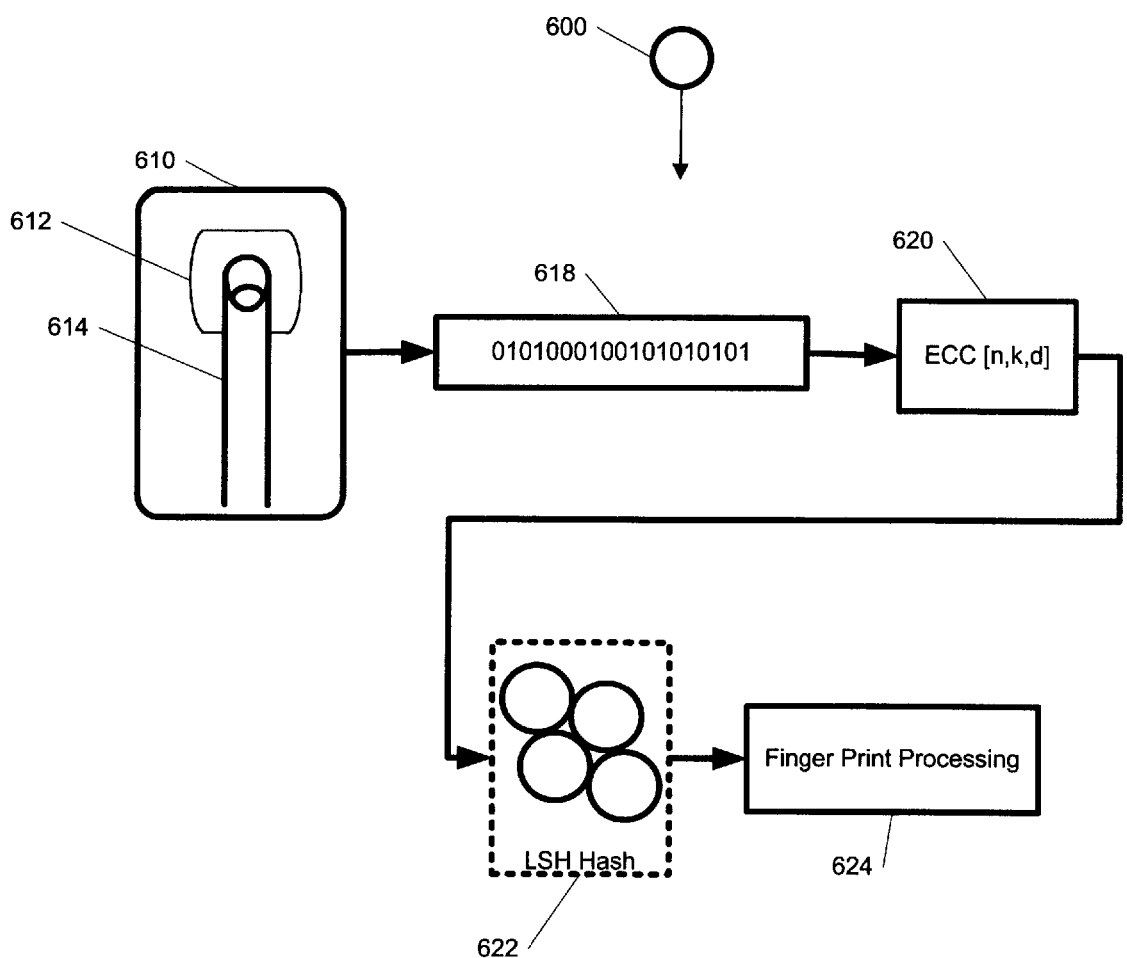
FIG. 6 is a block diagram illustrating identifying similar fingerprints.

FIG. 6 illustrates an example embodiment 600 of the present application used to identify similar fingerprints. A fingerprint scanner 610 is comprised of a sensor 612 over which a user places her finger 614. The scanner generates a digital representation of the fingerprint 618. Naturally, each fingerprint scan will produce slightly different digital representations 618, as small variations in skin, such as a small scratch or dirt, generates slightly different fingerprint scans. The binary representation 618 is processed through an [n,k,d] ECC reducing the information content from n GF(q) elements to k elements. The source code words 622 naturally corresponds code words that are similar according to the ECC. The source words are thus the LSH hash values as generated by the present application. The LSH hash value 622 is then sent for process 624 having identified code words corresponding to identical source words, i.e. LSH hashes, within the limits of the [n,k,d] ECC.

It is obvious to someone with ordinary skills in the art, that the example embodiment 600 illustrated on FIG. 6 naturally extends to voice prints, spoken passwords, or any other biometric measurement that generates a binary representation, and where small variations in biometric input may produce small variations in corresponding digital representations, and where those variations should be identified as belonging to the same person.

Similarly, It is obvious to someone with ordinary skills in the art, that the example embodiment 600 illustrated on FIG. 6 also extends to any type of digital representation of an object, where small variations in the object, or the sampling of a particular object property, leads to small variations in the digital representation. Those variations may be identified and accounted for using the teachings of the present application.

3.2 Hierarchical Layering

Figure 7:
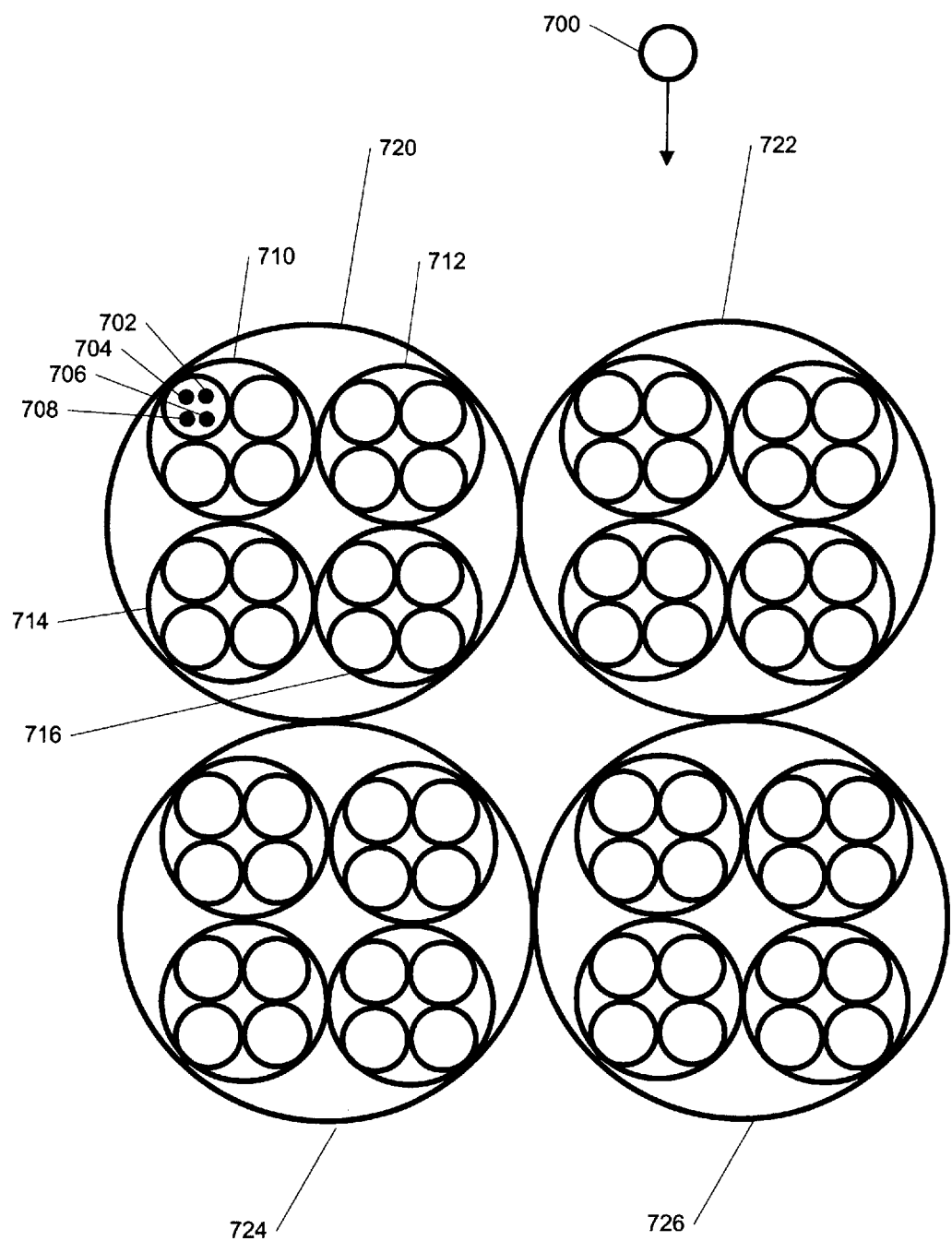
FIG. 7 is a block diagram illustrating hierarchical dimensional reduction.

FIG. 7 illustrates by way of example embodiment 700 a hierarchical layering of several ECCs. Four encoded words 702, 704, 706, 708 are grouped by a first ECC 710 into a new code word. Code words by this first-tier ECC 710, 712, 714, 716 are group by a second-tier ECC 720. Similarly second-tier code words 720, 722, 724, 726 are grouped by a third-tier ECC. It is obvious to someone with ordinary skills in the art that this process may continue for as long as there are encoded code words to combine. The present application thus naturally extends to a hierarchical architecture where each layers of encoding and decoding identify larger and parts of the code word space.

In continuation of the example embodiment illustrated on FIG. 6, it is thus reasonable to additionally add one or more tiers of ECC to identify increasing different fingerprints. By way of example, and not limitation, the first-tier ECC may correspond to identifying similar fingerprints when the finger is scanned in the same orientation. The second-tier ECC may correspond to identifying finger prints when the finger 614 is scanned held at a different angle over the scanner 612. Further tiers of ECC may be added if additional identification is possible based on e.g. different fingers, prints taken at different times allowing e.g. a scratch to be included, or other metric.

Alternatively, an [n,k,d] ECC with a larger minimum distance me be used to identify a larger group of code words. While this is a well-known, and in one sense the standard approach, it requires the entire information reduction to occur in one step. There are multiple advantages to using multiple hierarchical ECCs as it allows the decoding process to stop sooner, and thus preserve more of the original information before identification is made. The tiered approach allows custom designed ECCs to be deployed at each level, and thus, by way of example, use a first ECC for fingerprint identification, a second ECC to detect rotated fingerprints, and a third ECC to detect dirty fingers.

3.3 Applications to Search

A proximity search, also known as a "Nearest Neighbor Search (NSS)" is a common problem in optimization, data mining, and other data processing applications. Example use of NSS include identifying similar words, determining which residences belong to a particular post office, identifying words or speaker in speech recognition, determining that photos are similar, classification in machine learning and other machine learning algorithms.

In many of the modern NSS algorithm a measure, also called a metric, of "closeness" is given, and the NSS objective is stated as a minimization problem: Given a set S of points and a measure of distance between the points in S, determine for each point p∈S the closest point q∈S. The point q would be the "nearest neighbor" to the point p. The Nearest Neighbor Search naturally maps to the previous teachings regarding information reduction. In the context of an [n,k,d] ECC, the NSS may be restated as follows: The set of points correspond to the code words of length n, and the metric for closeness is provided by the minimum distance. The "search" is then not actually performed as a search, but rather as an ECC decoding step identifying code words (i.e. the neighbors) within $(d_{min}-1)/2$ error correcting capability of the [n,k,d] ECC. Please refer to section 1.1 for the error correcting capability of an [n,k,d] ECC and FIG. 3 for an illustration.

4.0 PREPROCESSING, MAPPINGS, AND TRANSFORMATIONS

By way of example consider a sensor such as a digital thermometer: The thermometer measures temperature and reports the temperature as one-byte measurements. One mapping of the temperature in degree Celsius would be from −128 degrees to 127 degrees using the commonly accepted mapping for a signed byte.

However, if it's known that the thermometer is intended to measure indoor temperature, it may be reasonable to assume that the temperature realistically should be expected to be between 15 degrees and 35 Celsius. It is thus possible to improve the precision by scaling the measured range from 15 to 35 so that e.g. a value of 0 (zero) corresponds to 15 degrees, and a reported value of 255 corresponds to 35. With the thermometer configured properly, the conversion then:

temp=sensor_reading*(35−15)/255+15

Figure 8:
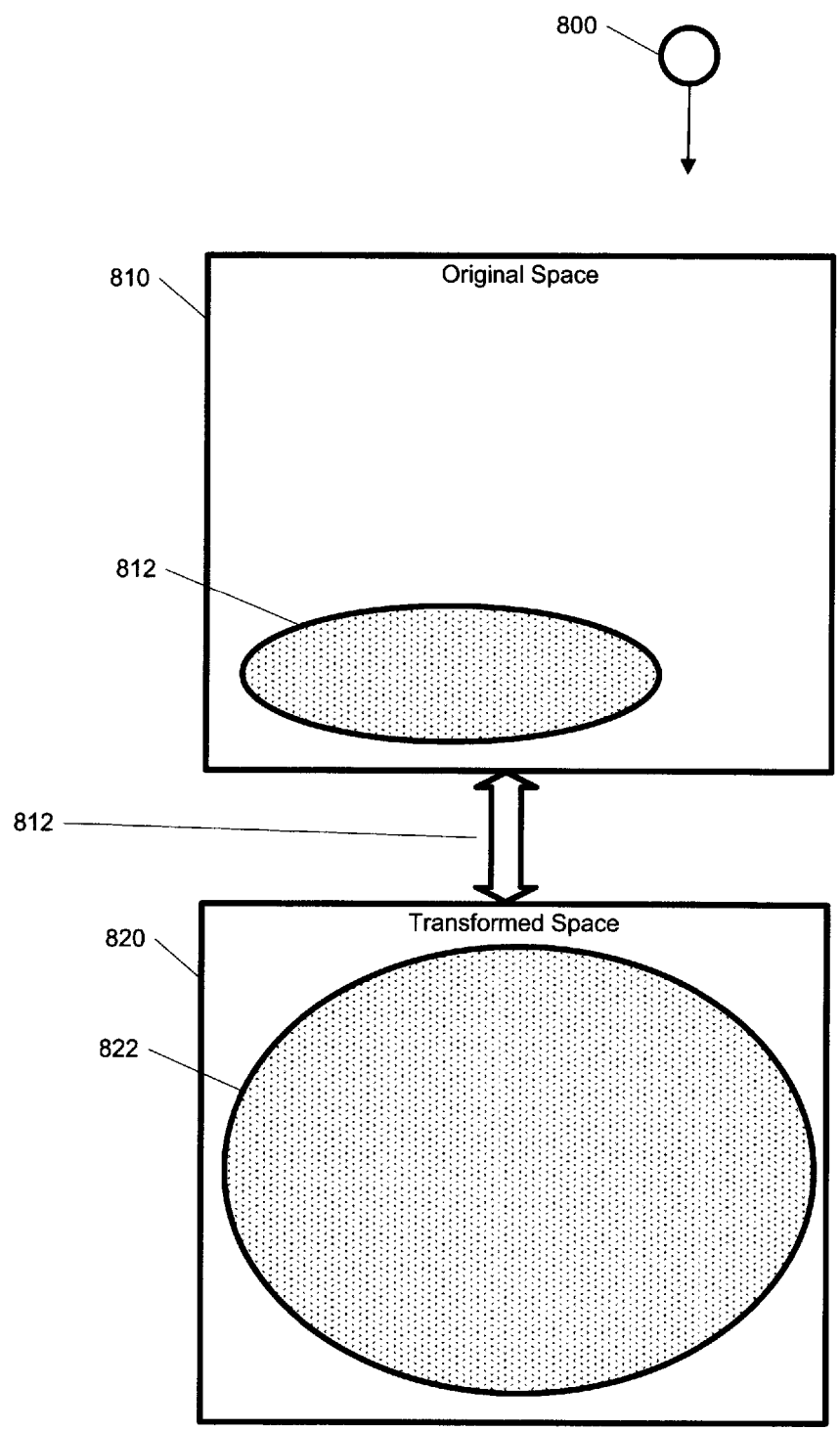
FIG. 8 is a block diagram illustrating transformations.

FIG. 8 illustrates by way of example embodiment 800, the example in a general context. If the full address space of the code words 810 is larger than actually observed code words 812, it may be beneficial to transform 812 the code words into similar address space 820 where the transformed code words 822 use the full address space or at least use more of it. This allows higher precision in conversions and calculations, and thus generally allows an ECC to correct more errors as the transformed code words use more of the available bits of precision.

A variety of well-known techniques exists for scaling and transformation of ranges. By way of example, and not limitation, the following teachings provide a few illustrative teachings and should be viewed as a few of many ways in which data may be scaled to better utilize available precision.

4.1 Moving Window/Relative Window

Figure 9:
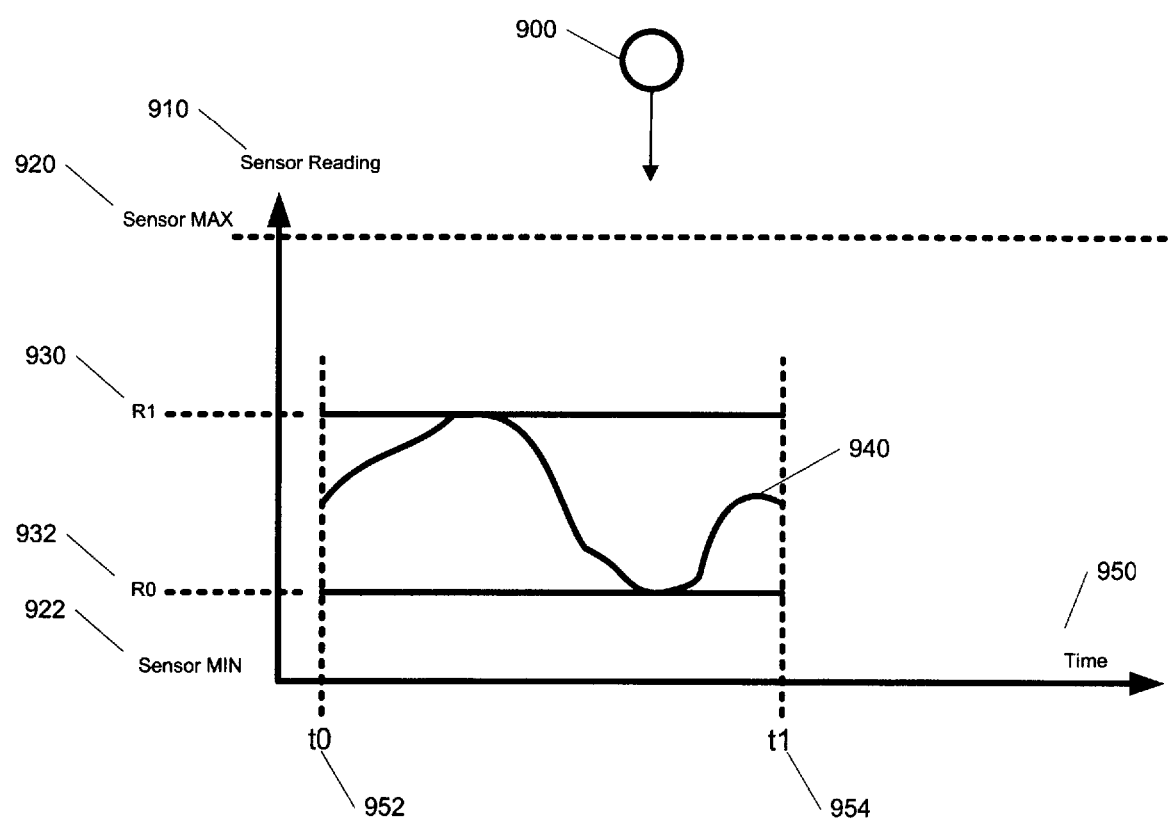
FIG. 9 is a block diagram illustrating sensor readings and normalization.

A commonly used technique, often called a "moving window", is illustrated by example embodiment on FIG. 9 900. A Sensor reading 900 is collected over time 950. The sensor range is known to be between a minimum value (Sensor MIN) 922 and a maximum value (Sensor MAX) 920. The sensor is recorded 940 between time t0 952 and t1 1954 and the observed sensor range is from a minimum value of R0 932 to a maximum value of R1 930. The sensor reading over the time interval t0–t1 may be transformed into the range of 0 to 1 (trans_01) as follows:

trans_01=(sensor−R0)/(R1−R0)

If the output range was known to be, by way of example and not limitation, 16 bits, the full range could be used by multiplying the transformed value (trans_01) by $2^{16}$.

The technique of "Windowing" is well known to someone with ordinary skills and generally considered one of the tools used in signal processing. Typically, Windowing is used to isolate, eliminate or enhance certain characteristics of a signal for a particular time frame. Wikipedia lists (https://en.wikipedia.org/wiki/Window_function) some of the better-known Windowing functions including rectangular, triangular, Parzen, Welch, Hamming and Generalized Hamming, Hann, and many others.

In the examples given above, Windowing was used to isolate specific sensor ranges and better utilize the available range and code word space. Other related uses include filtering noise, shaping spectrum, and adjusting amplification (gain) or reduction (loss).

4.2 Fisher and Inverse Fisher Transforms

It may be desirable to convert a set of observations, into a set of observations that approximate a Normal distribution, a.k.a. Gaussian distribution. The mathematical properties of Normal Distributions are well understood, are generally simple, and are thus often used.

The Fisher transform (https://en.wikipedia.org/wiki/Fisher_transformation) is an approximate variance-stabilizing transformation, with essentially means that for many data sets the transformed data has properties approximating a normal distribution.

The Fisher transform y of x is given by, where ln is the natural logarithm $y=0.5*\ln((1+x)/(1-x))$ This conversely means that the inverse transform ("Inverse Fisher"), i.e. solving for x, is $x=(e^{2y}-1)/(e^{2y}+1)$ The Inverse Fisher has as the characteristics that the values, i.e. x, is bounded by −1 and 1. In many situations it is thus a very effective way to normalize a data set, and ensure that all values are contained between −1 and 1.

Referring to the example embodiment 900 again for illustration: instead of having to empirically determine the minimum (sensorMIN 922) and maximum (sensorMAX 920) values of the data stream, the sensor data is first transformed with an Inverse Fisher and it is then known that sensorMIN=−1 and sensorMAX=1. For mapping to the range [0;1] please see below.

Generally, pre-processing by the Inverse Fisher transforms reduces the need to know the absolute limits of any sensor measurement and normalize the calculations it the range of −1 to 1.

At times, it may be more convenient to assume an unsigned range of 0 to 1 ($InvFisher_{01}$). Transformation for the standard [−1;1] Inverse Fisher (InvFisher) is easily performed by the following linear transformation $InvFisher_{01}=\frac{1}{2}*InvFisher+\frac{1}{2}$ The $InvFisher_{01}$ thus naturally maps to unsigned variables, whereas InvFisher naturally maps to signed variables.

4.3 Alpha Mappings

Assigning numerical values to letters similarly require pre-processing. For instance, referring to ASCII (American Standard Code for Information Interchange):

| Character | ASCII Value/Decimal | ASCII in Hex | ASCII in Binary |
|---|---|---|---|
| 'A' | 65 | 0x41 | 0100 0001 |
| 'B' | 66 | 0x42 | 0100 0010 |
| 'a' | 97 | 0x61 | 0110 0001 |

In the context of comparing letters, there is thus a difference of "1" between A (65) and B (66) when viewed as decimal numbers, whereas there is a difference of "32" between A (65) and 'a' (97). As this demonstrates simply using the ASCII values as textural representations of letters seems to indicate that the "distance" between A and B is substantially less than the "distance" between "a" and "A".

Looking at the character values in binary, it is worth observing that only one bit is different between 'A' and 'a' (corresponding to the different of $32=2^5$). This, however, is not always easy to exploit as the "one bit difference" only naturally maps to upper and lower case for letters.

Restating the textural comparisons in the contact of the present application: If the minimum distance is defined as the difference in decimal ASCII value, the difference between 'A' and 'a' is 32. If the minimum distance is defined as the number of bit-difference between 'A' and 'a', the minimum distance is 1.

The Unicode Standard specifies a consistent encoding, representation, and handling of text as expressed in most of the world's writing system. Unicode uses between 1 byte and 4 bytes to represent characters and thus present similar mapping challenges as presented above.

Ways to address the alphabetic mappings are typically language specific, and may involves pre-processing that maps all lower-case to upper-case, maps e.g. "l" to "lower-case L" (and vice versa), and ways to account for common typographical errors, typos, and abbreviations.

4.4 General Mappings

The above illustrative example embodiments are intended to demonstrate example embodiments of the general concept. It will be appreciated by someone with ordinary skills in the art that preprocessing, mappings, and transformations may take any form, not just the examples given.

By way of example, and not limitation, digital filters may be used to transform data. Digital filters may include transformations that operate in the time domain and transformations that operate in the frequency domain. By way of further example, transformations may include spectral transformation such as Fourier and Hilbert, filter banks, convolutions filters, and essentially any numeric processing of the data stream.

In general, any numeric processing of the data stream may be viewed as a transformation and utilized as such in the context of the present Application.

5.0 DATAFLOW

Figure 10:
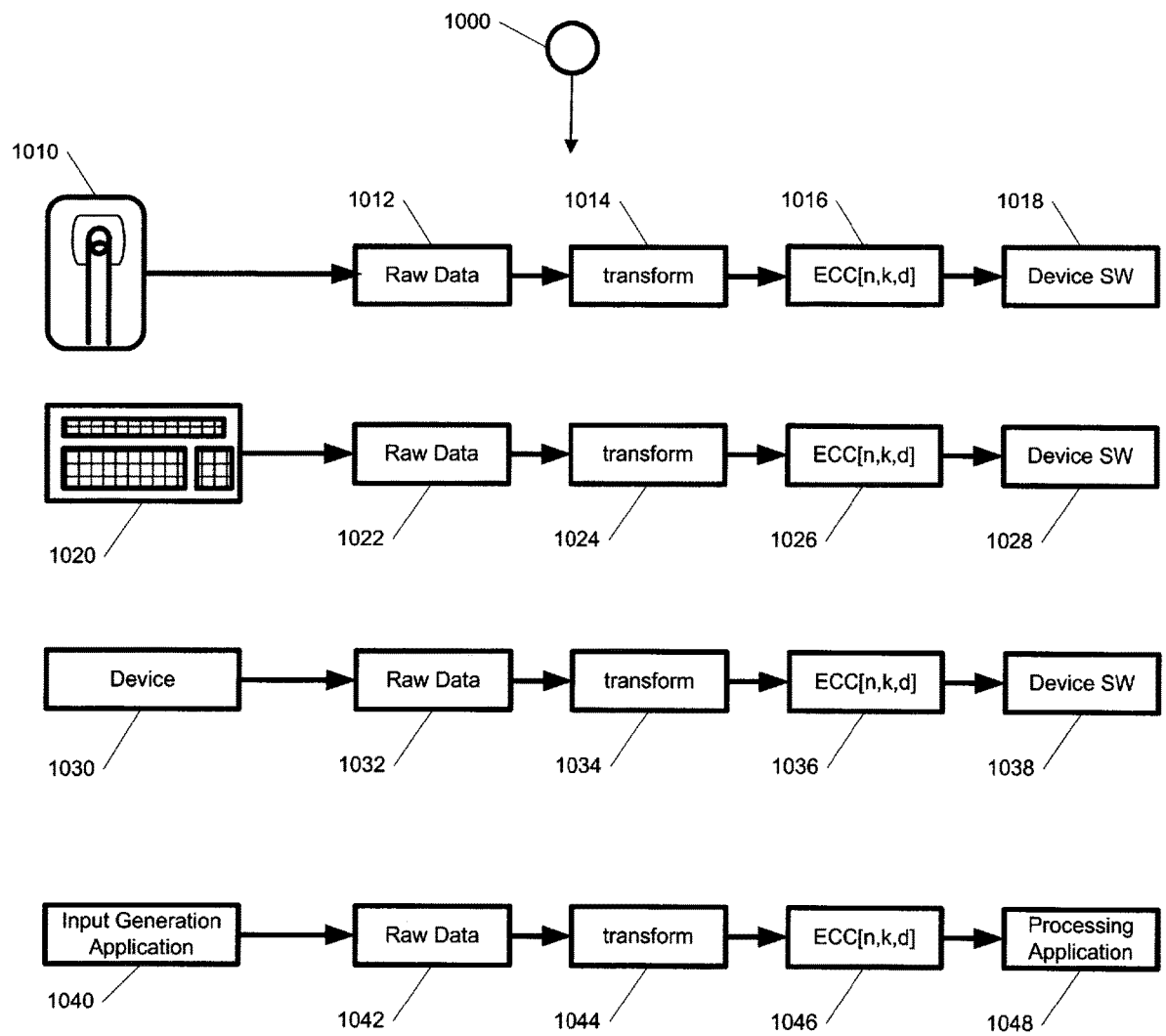
FIG. 10 is a block diagram illustrating various data flows.

FIG. 10 illustrate by way of example embodiment 1000, an infrastructure incorporating elements of the teachings of the previous sections.

By way of a first example, a fingerprint reader 1010 generates fingerprint data 1012 ("raw data"). The finger print data is transformed 1014 into the space of the ECC. The ECC 1016 for the fingerprint reader is run and the decoded data indicates provides a code-word estimate for the finger print scan. The code-word is provided to the software ("Device SW") 1018, which is the intended user of the finger print 1010 data. By way of example, one such device software may be an application to unlock a smart phone.

Similarly, a user types on a keyboard 1020, and the raw keyboard data 1022 is transformed 1024 into the space of the ECC. The ECC 1026 for the keyboard is run and the decoded data provides a code-word estimate for the keyboard data. The code-word is provided to the device software 1028 using the keyboard 1020 data. By way of example, one such device software may be an application to search the internet.

It will be appreciated by someone with ordinary skills in the art, that the previous two examples are illustrative of a general approach, where a device 1030 generates raw data 1032, which is then transformed 1034 into the space of an ECC. The ECC creates an estimated code-word, which is used by device software 1038 for the device 1030.

5.1 Data Flow for Applications

The same general data flow may be used if an application instead of a device creates the initial raw data. By way of example, an application 1040 generates raw data 1042, which is transformed 1044 into the space of the ECC. The ECC 1046 decodes the data and provide an estimated code-word for further processing by a processing application 1048.

By way of example, the Input Generation Application 1040 may be a web browser where the user types in a search term. The search term is the raw data 1042 which is transformed 1044 possibly using alpha mappings as previously taught. The ECC 1046 estimates a code-word for the search term and delivers the code-word to the search engine 1048 for further processing. The transformation 1044 may be provided using a plugin, and the ECC 1046 may be provided using a plugin. Using plugins allows the present application to be incorporate into existing applications, including web browsers, without requiring any customization of said existing applications.

5.2 Implementation Considerations

The previous disclosures used the terminology "Device Software" (1018, 1028, and 1038). It is appreciated by someone with ordinary skills, that the designation "Device SW" may include programs, processes, threads, device drivers, kernel drivers, kernel modules, plugins, mobile apps, and other designations for software executing on a processor.

By way of example, a device 1030 may have an associated device driver, and the raw data 1032 is delivered through a device driver. Similarly, a device 1030 may have an associated kernel module or kernel extension, and the raw data 1032 is delivered via said kernel module. In another embodiment a system library or other library is used to interface to the device 1030 and the raw data 1032 is provided via a library.

Alternatively, the device 1030 may be accessed using an application, and the raw data 1032 is delivered using an application level interface. By way of example, access to the raw data 1032 may be achieved through interception at the application layer, system layer, library layer, or kernel layer. The interception may use an Application Programming Interface (API) provided by the operating system, or an API provided by the application.

The Transform 1034 and ECC 1036 may similarly be accessed using one or more APIs, plugins, or programming interfaces and may be agnostic to the implementation of the Device and its operation. The Transform 1034 and ECC 1036 may be implemented using as one of application, one or more processes and threads, a device driver, a kernel module, a kernel extension, a plug-in, or other software implementation.

Similarly, for an Input Generation Application 1040 interception may be provided using an API provided by the Operating System, the Application, a library, via a plugin, or any other interface provided. The Transform 1044 and ECC 1046 may similarly be provided via API or plugin and may thus be agnostic to the implementation of the Input Generation Application 1040.

It is thus readily obvious to someone with ordinary skills in the art that the present application may interoperate with existing software using one or more of interception, plugins, or other interfaces.

6.0 APPLICATIONS IN BIG DATA AND MACHINE LEARNING

Machine Learning is field of computer science related to pattern recognition and computational learning. Machine Learning is an umbrella designation of a variety of computation techniques often involving evolving adaptive techniques. Machine Learning has been applied to speech recognition, voice recognition, biometrics recognition, optical character recognition (OCR), Computer Vision, and Search to name a few.

Several classes of machine learning contain elements of finding similar data objects and identifying them. For instance, OCR attempts to recognize text in images and should ideally recognize the letters independent of the font used.

Similarly, voice recognition may be used for spoken passwords and the Machine learning system way wish to identify similar voiceprints with one person. Similarly for spoken control, where small variances in ambient noise or speaker intonation, should be acceptable.

In Search, it may be desirable to identify common spellings and misspellings and thus provide the same search results in view of minor typos.

It is thus readily apparent to someone with ordinary skills in the art that the teachings of the present application applies broadly to Machine Learning, and may be used in one or more of the algorithms of Machine Learning.

7.0 APPLICATION TO HOSTED APPLICATIONS AND STREAMING APPLICATIONS

Application Hosting and Application Streaming may be components of many "Cloud" products: Applications and services are streamed or hosted to clients and a client uses a web browser or a streaming infrastructure to access said hosted or streaming services. The present application may be advantageously used in the context of hosted applications to reduce duplication of data, duplication of processing, and other activities which may be identified being essentially different instances of the same base activity.

8.0 FAULT DETECTION

The present application may advantageously be used in Fault Detection and Application Agnostic Fault Detection. As taught in Ser. Nos. 13/017,340 and 13/017,717, the disclosures of which were included in their entirety by reference, one of the bigger challenges in fault detection is elimination of duplicate or redundant fault detection events. The information reduction teachings of the present application may be used to consolidate, i.e. identify, a variety of fault events with common root causes.

9.0. APPLICATIONS FOR MOBILE AND EMBEDDED DEVICES

The present application is directly applicable to mobile and embedded devices. Common limitation of a typical mobile device is less memory, less processing power, limited network bandwidth, limited Input/Output (I/O), and battery operation when compared to a desktop or server system. It is thus desirable to pre-process as much information as possible before engaging the CPU and network in a computationally expensive operation. Error Correction Codes are well understood and computationally efficient. Modern multi-media integrated circuits (ICs) may contain functionality to accelerate ECC calculations as ECCs are widely used in storage and data communication systems.

It is thus readily apparently to someone with ordinary skills in the art, that the present application advantageously may be used in mobile and embedded systems to pre-process information, identify similarities, and thus enable a more efficient use of the CPU, memory, network, and I/O.

10. DEPLOYMENT SCENARIOS

Figure 11:
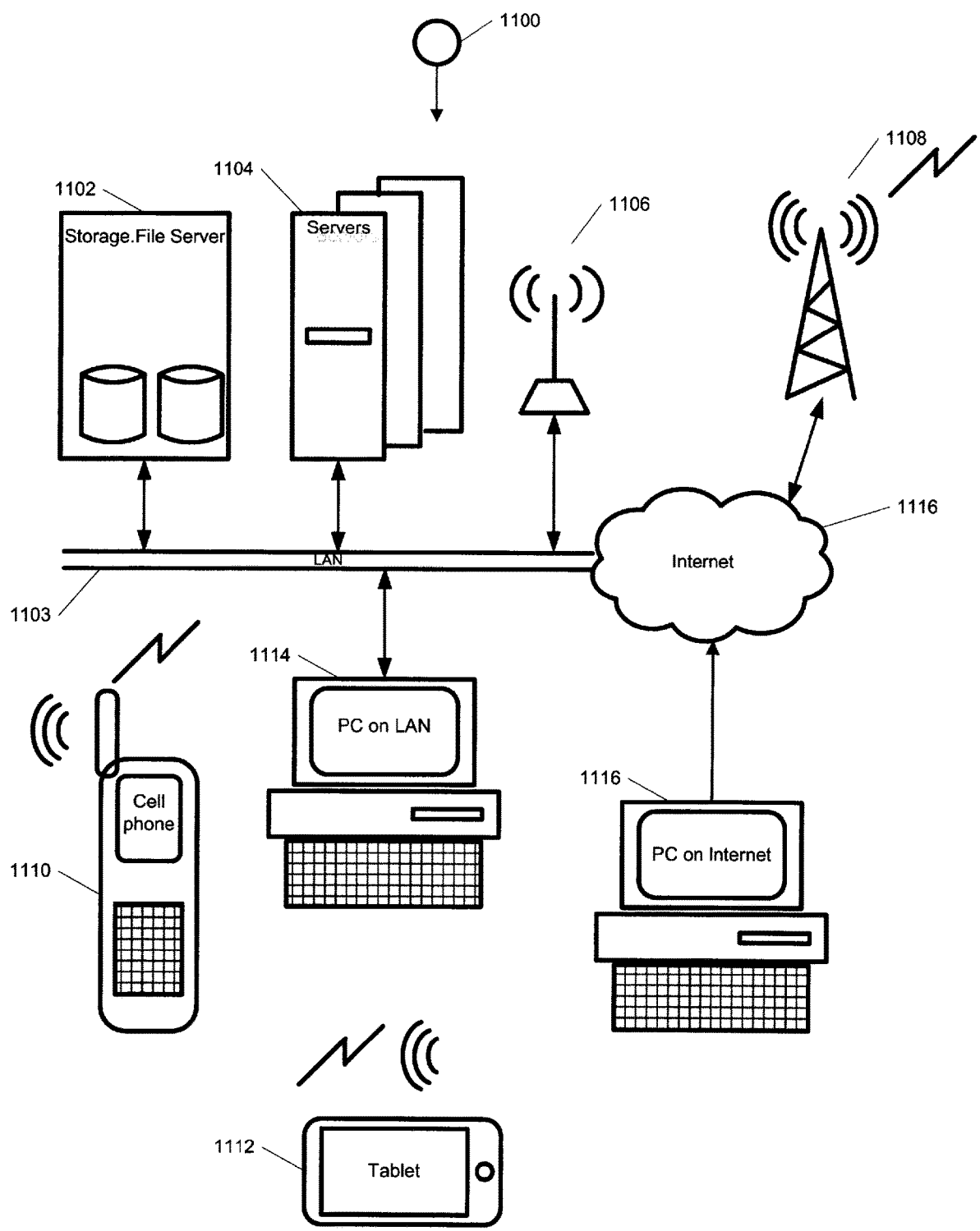
FIG. 11 is a block diagram illustrating various configurations.

FIG. 11 illustrates by way of example embodiment 1100 a variety of ways the application can be configured to operate.

In one embodiment, the application is configured with a central file server 1102 and one or more servers 1104. The servers 1104 and storage 1102 are connected to a local area network (LAN) 1103 and the network is connected to the internet 1116 for external access. In one embodiment Wi-Fi 1106 is provided for Wi-Fi access to the LAN. In another embodiment a personal computer, laptop, Chromebook, or other similar device 1114 is connected to the network 1103 using one or more of network 1103 or Wi-Fi 1106. In another embodiment a cellular wireless or public Wi-Fi 1108 is supported and connected via the internet 1116 to the LAN 1103. In yet another embodiment a cellular phone 1110, tablet 1112 or other mobile device is connected to using one of Wi-Fi 1106 or cellular or public Wi-Fi 1108. In another embodiment a personal computer, Chromebook, laptop, or other similar device 1116 is connected to the internet 1116.

Finally, the present application works universally independent of device type, network type, and operating system. The illustrated example embodiments should not be construed as limiting the scope of the application but as merely providing illustrations of some of the exemplary embodiments.

11. CONCLUSION

In the embodiments described herein, an example programming environment, systems and configurations were disclosed for which one or more embodiments according to the application were taught. It should be appreciated that the present application can be implemented by one of ordinary skill in the art using different program organizations and structures, different data structures, different configurations, different systems, and of course any desired naming conventions without departing from the teachings herein. In addition, the application can be ported, or otherwise configured for, use across a wide-range of operating system environments.

Although the description above contains many details, these should not be construed as limiting the scope of the application but as merely providing illustrations of some of the exemplary embodiments of this application. Therefore, it will be appreciated that the scope of the present application fully encompasses other embodiments which may become obvious to those skilled in the art, and that the scope of the present application is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present application, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A system, comprising:
    one or more memory locations configured to store one or more Error Correcting Code ECC(n,k) of length n and dimension k, where n>k, and vectors of length n (n-vector); and
    one or more Central Processing Unit (CPU) operatively connected to said one or more memory locations and configured to decode said n-vector using said ECC(n,k) to generate a k-vector and store said k-vector in the one or more memory locations.

2. The system according to claim 1, wherein said CPU execute said one or more ECC(n,k) on a host with a host operating system that is one of Linux, UNIX, Solaris, HP/UX, Android, iOS, MacOS, or Microsoft Windows.

3. The system according to claim 1, wherein one or more pairs of (n-vector, k-vector) are stored in one of said second memory locations, and wherein a pair's k-vector is an information-reduced representation of the pair's n-vector.

4. The system according to claim 1, wherein said ECC (n,k) reduces the n-dimensional n-vector to a k-dimensional k-vector, and said ECC(n,k) is one or more of a linear error correcting code and a Maximum Separable (MDS) error correcting code.

5. The system according to claim 1, wherein said ECC (n,k) is an error correcting code with a minimum distance d.

6. The system according to claim 1, wherein said ECC (n,k) is one of a Reed-Solomon (RS) error code, a Bose, Ray-Chaudhuri, Hocquenghem (BCH) error correcting code, Golay error correction code, Hamming error correcting code, convolution code, other error correcting code of length n with dimension k.

7. The system according to claim 1, wherein said n-vectors and said k-vectors are comprised of elements from a finite field F.

8. The system according to claim 7, wherein said finite field F has a number of elements that is a power of 2.

9. The system according to claim 1, wherein said ECC is implemented as one or more of an application, one or more processes and threads, a device driver, a kernel module, a kernel extension, a plug-in, or other software implementation.

10. The system according to claim 1, wherein each n-vector is transformed prior to information reduction using a windowing function.

11. The system according to claim 10, where said windowing function is one of rectangular, triangular, Parzen, Welch, Hamming and Generalized Hamming, Hann, or other Windowing function.

12. The system according to claim 1, wherein each n-vector is transformed prior to information reduction using an inverse Fisher transform.

13. The system according to claim 1, wherein each n-vector is transformed prior to information reduction as pre-processing for one or more of speech recognition, voice-prints, optical character recognition, or other biometrics.

14. The system according to claim 1, wherein each n-vector is transformed prior to information reduction as pre-processing for a search application, or other alphanumeric processing application.

15. A system, comprising:
    one or more memory locations configured to store one or more Error Correcting Code $ECC_i$ of length $n_i$ and dimension $k_i$ configured as $n_i$-vectors and $k_i$-vectors, where i=1 . . . m, m>=1, and $n_i$>$k_i$; and
    one or more Central Processing Unit (CPU) operatively connected to said one or more memory locations and configured to decode said n-vector using said ECC(n,k) to generate a $k_i$-vector and stores said $k_i$-vector in the one or more memory locations.

16. The system according to claim 15, wherein said host operating system is one of Linux, UNIX, Solaris, HP/UX, Android, iOS, MacOS, or Microsoft Windows.

17. The system according to claim 15, wherein each said $ECC_i$ is one or more of linear error correcting code, Convolution error correcting code, and a Maximum Separable (MDS) error correcting code.

18. The system according to claim 15, wherein each said $ECC_i$ is one of a Reed-Solomon (RS) error code, a Bose, Ray-Chaudhuri, Hocquenghem (BCH) error correcting code, Golay error correction code, Hamming error correcting code, and other error correcting code of length $n_i$ with dimension $k_i$.

19. The system according to claim 15, wherein each said $n_i$-vectors and said $k_i$-vector are comprised of elements from a finite field F.

20. The system according to claim 15, wherein each said $ECC_i$ is implemented as one or more of an application, one or more processes and threads, a device driver, a kernel module, a kernel extension, a plug-in, or other software implementation.

* * * * *